(12) United States Patent
Jang et al.

(10) Patent No.: US 11,330,387 B2
(45) Date of Patent: May 10, 2022

(54) METHOD AND APPARATUS FOR CONTROLLING AUDIO SIGNAL FOR APPLYING AUDIO ZOOMING EFFECT IN VIRTUAL REALITY

(71) Applicants: Electronics and Telecommunications Research Institute, Daejeon (KR); CHUNG ANG UNIVERSITY INDUSTRY ACADEMIC COOPERATION FOUNDATION, Seoul (KR)

(72) Inventors: Dae Young Jang, Daejeon (KR); Jae-hyoun Yoo, Daejeon (KR); Yong Ju Lee, Daejeon (KR); Tae Jin Lee, Daejeon (KR); Sang Wook Kim, Seoul (KR)

(73) Assignees: Electronics and Telecommunications Research Institute, Daejeon (KR); CHUNG ANG UNIVERSITY INDUSTRY ACADEMIC COOPERATION FOUNDATION, Seoul (KR)

( * ) Notice: Subject to any disclaimer, the term of this patent is extended or adjusted under 35 U.S.C. 154(b) by 97 days.

(21) Appl. No.: 16/647,458

(22) PCT Filed: Oct. 1, 2019

(86) PCT No.: PCT/KR2019/012812
§ 371 (c)(1),
(2) Date: Mar. 13, 2020

(87) PCT Pub. No.: WO2020/071728
PCT Pub. Date: Apr. 9, 2020

(65) Prior Publication Data
US 2021/0258709 A1 Aug. 19, 2021

(30) Foreign Application Priority Data

Oct. 2, 2018 (KR) .................. 10-2018-0117832
Jan. 14, 2019 (KR) .................. 10-2019-0004781

(51) Int. Cl.
*H04S 7/00* (2006.01)
*G06F 3/01* (2006.01)
*G06T 19/00* (2011.01)

(52) U.S. Cl.
CPC .............. *H04S 7/302* (2013.01); *G06F 3/013* (2013.01); *G06T 19/006* (2013.01);
(Continued)

(58) Field of Classification Search
CPC .. H04S 7/302; H04S 2400/11; H04S 2400/13; H04R 2499/15; G06F 3/013; G06T 19/006
See application file for complete search history.

(56) References Cited

U.S. PATENT DOCUMENTS

2014/0098198 A1 4/2014 Lee et al.
2015/0222780 A1* 8/2015 Lee .................. H04N 5/232945
348/231.99
(Continued)

FOREIGN PATENT DOCUMENTS

JP 2014204320 A 10/2014
KR 1020120094046 A 8/2012
(Continued)

*Primary Examiner* — David L Ton
(74) *Attorney, Agent, or Firm* — William Park & Associates Ltd.

(57) ABSTRACT

An audio signal controlling method includes identifying whether an audio zooming effect is used for at least one audio object present in a virtual reality (VR) through an audio zooming effect field included in metadata, and con-
(Continued)

trolling an audio signal corresponding to the audio object based on a preset method when the audio zooming effect is identified as being used.

11 Claims, 10 Drawing Sheets

(52) U.S. Cl.
CPC ....... *H04R 2499/15* (2013.01); *H04S 2400/11* (2013.01); *H04S 2400/13* (2013.01)

(56) References Cited

U.S. PATENT DOCUMENTS

| | | |
|---|---|---|
| 2016/0225153 A1 | 8/2016 | Kim |
| 2016/0277865 A1 | 9/2016 | Lee et al. |
| 2017/0045941 A1 | 2/2017 | Tokubo et al. |
| 2017/0230760 A1 | 8/2017 | Sanger et al. |
| 2020/0344564 A1* | 10/2020 | Laaksonen ......... H04N 21/8106 |

FOREIGN PATENT DOCUMENTS

| | | |
|---|---|---|
| KR | 1020130130740 A | 12/2013 |
| KR | 101683385 B1 | 12/2016 |
| KR | 1020170114318 A | 10/2017 |
| KR | 1020180032690 A | 3/2018 |
| WO | 2017037032 A1 | 3/2017 |
| WO | 2018194320 A1 | 10/2018 |

* cited by examiner

METHOD AND APPARATUS FOR CONTROLLING AUDIO SIGNAL FOR APPLYING AUDIO ZOOMING EFFECT IN VIRTUAL REALITY

TECHNICAL FIELD

One or more example embodiments relate to a method and apparatus for controlling an audio signal to apply an audio zooming effect in a virtual reality (VR).

BACKGROUND ART

An audio zooming effect, which is also referred to as a cocktail party effect, refers to an effect of an ability to focus an auditory attention on a voice of a counterpart in a conversation in a noisy place such as, for example, where a cocktail party is held. That is, it refers to an effect of a selective attention using a spatial characteristic, for example, a tone of a sound source or an audio source, a reflected sound, and a reverberating sound, and using a characteristic of a transmission path of an audio source, for example, a level, time, and frequency characteristic difference, of an audio signal to be transmitted to both ears.

However, when a content is transmitted through media, information associated with a transmission path of an audio source included in the content may not suffice, which may obstruct the selective attention. Thus, an existing method such as dialogue enhancement may be used to amplify a volume of a relatively significant sound on a relatively insignificant sound, thereby enhancing or magnifying the significant sound.

However, such existing method may not be readily applicable to a virtual reality (VR) space and immersive media that enable an interaction with an object. Thus, there is a desire for technology for enhancing or magnifying an audio source in which a listener is interested among a plurality of audio sources in a VR.

DISCLOSURE

Technical Goals

An aspect of the present disclosure provides a method and apparatus for controlling an audio signal to reproduce an audio zooming effect corresponding to a specific audio object for a listener who moves unrestrictedly in a virtual reality (VR).

Another aspect of the present disclosure provides a method and apparatus for controlling an audio signal to reproduce a content by applying an audio zooming effect corresponding to an activated audio object in a VR.

Technical Solutions

According to an example embodiment, there is provided an audio signal controlling method including identifying whether an audio zooming effect is used for at least one audio object present in a virtual reality (VR) through an audio zooming effect field included in metadata, and controlling an audio signal corresponding to the audio object based on a preset method when the audio zooming effect is identified as being used.

When the audio zooming effect corresponding to the audio object is used, the identifying of whether the audio zooming effect is used may include determining whether to activate the audio zooming effect for the audio object.

The determining of whether to activate the audio zooming effect may include determining whether to activate the audio zooming effect based on a gaze of a user, a distance between the user and the audio object, or a random selection by the user.

The controlling of the audio signal corresponding to the audio object based on the preset method may include controlling the audio signal based on a volume level adjustment method such that a volume level of an activated audio object increases by a preset level compared to a volume level of an inactivated audio object, controlling the audio signal based on a direct to reverberant (D/R) ratio (a ratio of a direct sound to a reflected sound) adjustment method to control a D/R ratio of the activated audio object and a D/R ratio of the inactivated audio object, or controlling the audio signal based on a frequency characteristic control method to control a frequency characteristic of each of the activated audio object and the inactivated audio object by using a filter.

The controlling of the audio signal corresponding to the audio object based on the preset method may include determining whether to increase a volume or a gain of the audio object in inverse proportion to the distance between the user and the activated audio object.

According to another example embodiment, there is provided an audio signal controlling method including identifying at least one audio object included in a content to reproduce the content in a VR, determining whether to activate an audio zooming effect corresponding to the identified audio object, and applying the audio zooming effect to the content by controlling an audio signal corresponding to the audio object based on a preset method, when the audio zooming effect is activated.

The determining of whether to activate the audio zooming effect may include determining whether to activate the audio zooming effect based on an audio object corresponding to a gaze of a user in the VR, a distance between the user and the audio object, or a random selection by the user.

The applying of the audio zooming effect to the content by controlling the audio signal based on the preset method may include applying the audio zooming effect to the content based on a volume level adjustment method that controls a volume level of an activated audio object to increase by a preset level compared to a volume level of an inactivated audio object, applying the audio zooming effect to the content based on a D/R ratio adjustment method that controls a D/R ratio of the activated audio object and a D/R ratio of the inactivated audio object, or applying the audio zooming effect to the content based on a frequency characteristic control method that controls a frequency characteristic of each of the activated audio object and the inactivated audio object by using a filter.

When the distance between the user and the activated audio object is relatively short, compared to when a distance between the user and an activated audio object is relatively long, the applying of the audio zooming effect to the content by controlling the audio signal based on the present method may include applying the audio zooming effect to increase a volume or a gain of the audio object present in the relatively short distance.

According to still another example embodiment, there is provided an audio signal controlling apparatus including a processor, and a memory including a computer-readable instruction. When the instruction is executed by the processor, the processor may be configured to identify whether an audio zooming effect is used for at least one audio object present in a VR through an audio zooming effect field included in metadata, and control an audio signal corresponding to the audio object based on a preset method when the audio zooming effect is identified as being used.

For the identifying of whether the audio zooming effect is used for the audio object, the processor may be configured to determine whether to activate the audio zooming effect for the audio object, when the audio zooming effect corresponding to the audio object is used.

The processor may be configured to determine whether to activate the audio zooming effect based on a gaze of a user, a distance between the user and the audio object, or a random selection by the user.

For the controlling of the audio signal corresponding to the audio object based on the preset method, the processor may be configured to control the audio signal based on a volume level adjustment method such that a volume level of an activated audio object increases by a preset level compared to a volume level of an inactivated audio object, control the audio signal based on a D/R ratio (a ratio of a direct sound to a reflected sound) adjustment method that controls a D/R ratio of the activated audio object and a D/R ratio of the inactivated audio object, or control the audio signal based on a frequency characteristic control method that controls a frequency characteristic of each of the activated audio object and the inactivated audio object by using a filter.

For the controlling of the audio signal corresponding to the audio object based on the preset method, the processor may be configured to determine whether to increase a gain or a volume of the audio object in inverse proportion to the distance between the user and the activated audio object.

According to yet another example embodiment, there is provided an audio signal controlling apparatus including a processor, and a memory including a computer-readable instruction. When the instruction is executed by the processor, the processor may be configured to identify at least one audio object included in a content to reproduce the content in a VR, determine whether to activate an audio zooming effect corresponding to the identified audio object, and applying the audio zooming effect to the content by controlling an audio signal corresponding to the audio object when the audio zooming effect is activated.

The processor may be configured to determine whether to activate the audio zooming effect based on an audio object corresponding to a gaze of a user in the VR, a distance between the user and the audio object in the VR, or a random selection by the user.

For the applying of the audio zooming effect to the content by controlling the audio signal corresponding to the audio object based on the preset method, the processor may be configured to apply the audio zooming effect to the content based on a volume level adjustment method that controls a volume level of an activated audio object to increase by a preset level compared to a volume level of an inactivated audio object, apply the audio zooming effect to the content based on a D/R ratio (a ratio of a direct sound to a reflected sound) adjustment method that controls a D/R ratio of the activated audio object and a D/R ratio of the inactivated audio object, or apply the audio zooming effect to the content based on a frequency characteristic control method that controls a frequency characteristic of each of the activated audio object and the inactivated audio object by using a filter.

For the applying of the audio zooming effect to the content by controlling the audio signal corresponding to the audio object based on the preset method, the processor may be configured to apply the audio zooming effect to increase a gain or a volume of an audio object present in a relatively short distance, when a distance between the user and an activated audio object is relatively short, compared to when a distance between the user and an activated audio object is relatively long.

Advantageous Effects

According example embodiments described herein, there is provided a method of controlling an audio signal to reproduce an audio zooming effect corresponding to a specific audio object for a listener who moves unrestrictedly in a virtual reality (VR).

According to other example embodiments described herein, there is provided a method of controlling an audio signal to reproduce a content by applying an audio zooming effect corresponding to an activated audio object in a VR.

BEST MODE FOR CARRYING OUT THE INVENTION

Hereinafter, example embodiments will be described in detail with reference to the accompanying drawings. Regarding the reference numerals assigned to the elements in the drawings, it should be noted that the same elements will be designated by the same reference numerals, wherever possible, even though they are shown in different drawings.

It should be understood, however, that there is no intent to limit this disclosure to the example embodiments disclosed herein. On the contrary, example embodiments are to cover all modifications, equivalents, and alternatives falling within the scope of the example embodiments.

Terms such as first, second, A, B, (a), (b), and the like may be used herein to describe components. Each of these terminologies is not used to define an essence, order, or sequence of a corresponding component but used merely to distinguish the corresponding component from other component(s). For example, a first component may be referred to as a second component, and similarly the second component may also be referred to as the first component.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof.

Unless otherwise defined, all terms, including technical and scientific terms, used herein have the same meaning as commonly understood by one of ordinary skill in the art to which this disclosure pertains based on an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Also, in the description of example embodiments, detailed description of structures or functions that are thereby known after an understanding of the disclosure of the present application will be omitted when it is deemed that such description will cause ambiguous interpretation of the example embodiments.

Hereinafter, example embodiments of the present disclosure will be described in detail with reference to the accompanying drawings.

Figure 1:
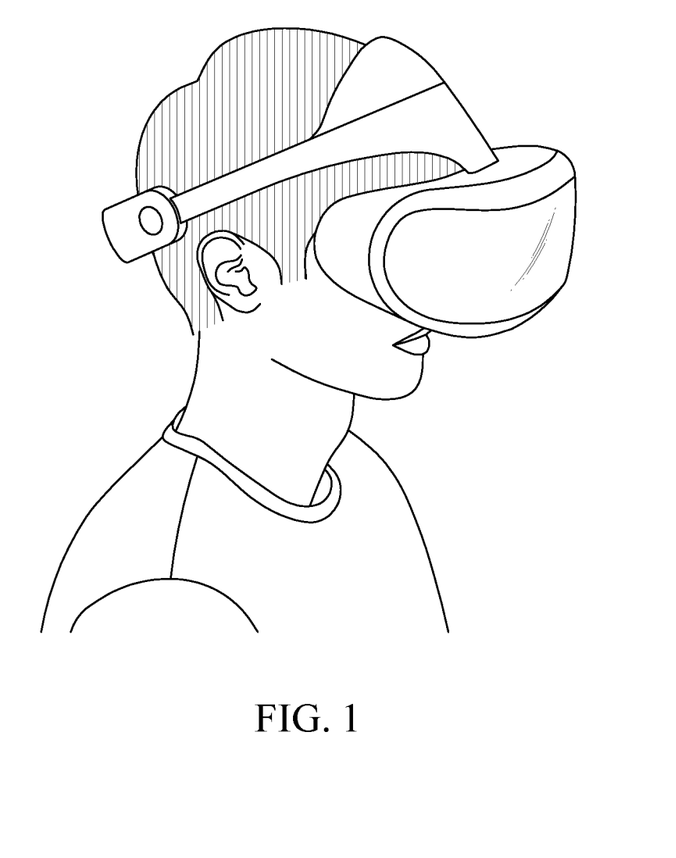
FIG. 1 is a diagram illustrating an example of a user wearing a head-mounted display (HMD).

FIG. 1 is a diagram illustrating an example of a user wearing a head-mounted display (HMD).

When a person listens to a natural sound, the person may selectively focus on an audio signal by analyzing a characteristic of a transmission path of an audio signal arrived at both ears. This is called a cocktail party effect. However, when a person or a user listens to an audio signal transmitted through media, it may not be easy to analyze a characteristic of a transmission path of the audio signal, and thus an additional method may be used to apply an audio zooming effect. That is, to such audio signal to be transmitted through media, the audio zooming effect such as the cocktail party effect may be applied. Hereinafter, how an audio zooming effect is applied to an audio signal to be transmitted through media will be described.

A user may experience a virtual reality (VR) with an HMD on. A content to be reproduced in the VR may include at least one audio object, and the audio object may be reproduced selectively. For example, an audio object may be reproduced through an interaction with the user, or may not be reproduced based on a preference of the user or a selection by the user. In this example, an audio signal corresponding to the audio object may be controlled based on a preset method, and an audio zooming effect may be applied thereby. A detailed method of controlling an audio signal to apply an audio zooming effect in a VR, which is simply referred to herein as an audio signal controlling method, will be described hereinafter.

Figure 2:
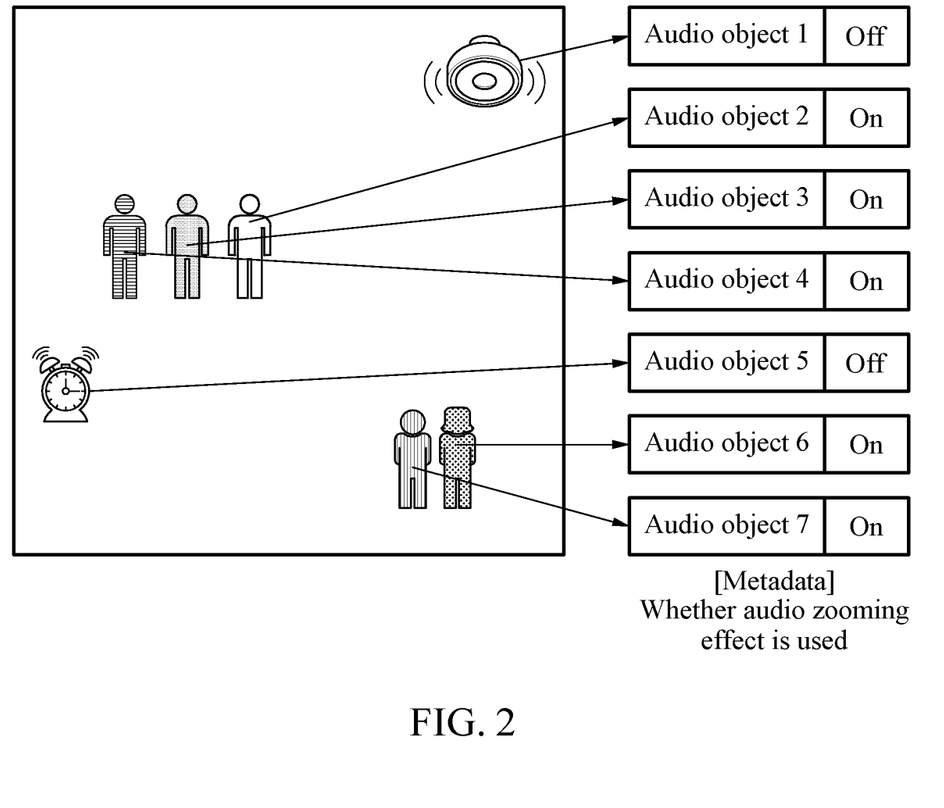
FIG. 2 is a diagram illustrating an example of identifying whether an audio zooming effect is used for an audio object to reproduce a content including at least one audio object according to an example embodiment.

FIG. 2 is a diagram illustrating an example of identifying whether an audio zooming effect is used for an audio object to reproduce a content including at least one audio object according to an example embodiment.

A content to be reproduced in a VR may include at least one audio object. For example, referring to FIG. 2, a content to be reproduced includes audio objects 1 through 8.

An audio zooming effect may be used or not be used for each audio object. For example, as illustrated, when a user determines audio objects 1 and 5 to be insignificant, the user may set an audio zooming effect corresponding to each of audio objects 1 and 5 to be turned off not to use the audio zooming effect for them. In this example, when the user determines audio objects 2, 3, 4, 6, and 7 to be significant, the user may set an audio zooming effect corresponding to each of audio objects 2, 3, 4, 6, and 7 to be turned on to use the audio zooming effect for them.

When an audio zooming effect is set to be on to be used, whether to activate an audio zooming effect corresponding to an audio object may be determined based on an interaction between a user and the audio object in a VR. For example, as illustrated, when the audio zooming effect is activated by an interaction between the user and audio object 2, the audio zooming effect corresponding to audio object 2 may be applied and the content may be reproduced accordingly. Thus, the user may selectively and thereby more readily listen to audio object 2 through the audio zooming effect corresponding to audio object 2.

Here, information as to whether an audio zooming effect corresponding to each audio object is used or not may be included in an audio zooming effect field of metadata provided for object-based audio rendering.

According to an example embodiment, identifying whether an audio zooming effect is used for an audio object may be applied to a six degrees of freedom (6DoF) VR content, a 6DoF VR game, and 6DoF VR-based social network communication. For example, a user moving in a VR may apply such audio zooming effect to a dialogue sound of interest to the user and listen to the dialogue sound to which the audio zooming effect is applied. In addition, in the 6DoF VR-based social network communication, a user may apply the audio zooming effect to a voice of a counterpart in conversation with the user and listen to the voice to which the audio zooming effect is applied.

Figure 3:
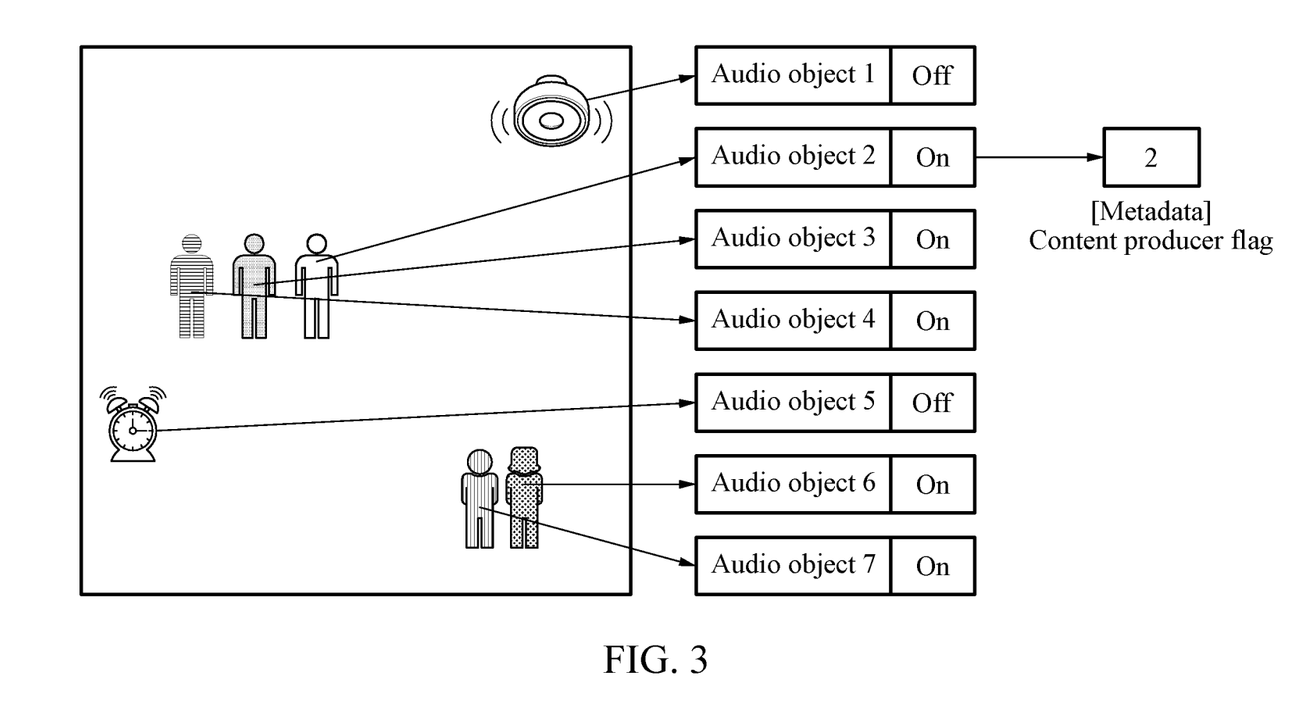
FIG. 3 is a diagram illustrating another example of identifying whether an audio zooming effect is used for an audio object to reproduce a content including at least one audio object according to an example embodiment.

FIG. 3 is a diagram illustrating another example of identifying whether an audio zooming effect is used for an audio object to reproduce a content including at least one audio object according to an example embodiment.

Dissimilar to the example of FIG. 2 in which whether an audio zooming effect is used or not is set by a user, FIG. 3 illustrates an example of setting use or nonuse of an audio zooming effect through a content producer flag. A producer of a content to be reproduced in a VR may set in advance whether to use an audio zooming effect to reproduce the content, using a content producer flag. In such case, when the audio zooming effect is set to be on, the audio zooming effect corresponding to the content producer flag may be activated without an interaction between a user and an audio object for which the audio zooming effect is set to be on, dissimilar to a case in which whether to activate the audio zooming effect is determined by the interaction between the user and the audio object as illustrated in FIG. 2. The content producer flag may be included in metadata to be transmitted.

For example, as illustrated, when a producer of a content is set in advance to use an audio zooming effect for audio object 2 through a content producer flag, the audio zooming effect corresponding to audio object 2 may be applied without an interaction between a user and audio object 2 and the content may be reproduced accordingly.

In an example, when a producer of a 6DoF VR content sets a content producer flag for an audio object for which an attention needs to be induced from a listener based on a preset story, an audio zooming effect corresponding to the audio object may be applied regardless of a direction and a distance between the listener and the audio object, and then the content may be reproduced accordingly.

In another example, in 6DoF VR-based social network communication, a producer of a content may set in advance a content producer flag to market or notify it.

Figure 4:
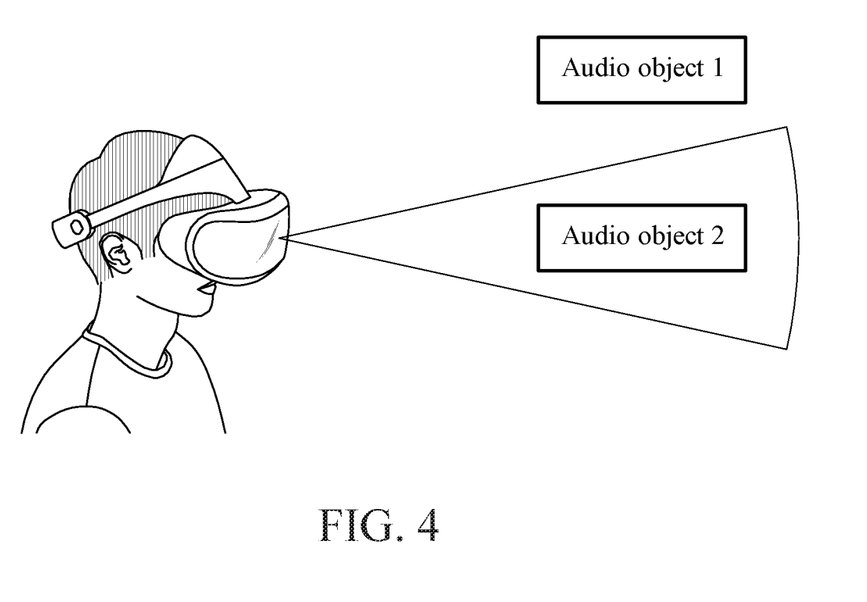
FIG. 4 is a diagram illustrating an example of determining whether to activate an audio zooming effect corresponding to an audio object based on a gaze of a user according to an example embodiment.

FIG. 4 is a diagram illustrating an example of determining whether to activate an audio zooming effect corresponding to an audio object based on a gaze of a user according to an example embodiment.

In an example, when an audio zooming effect corresponding to an audio object is set to be used, the audio zooming effect corresponding to the audio object may be activated based on a gaze of a user. For example, when a user views a content in a VR, an audio object included in the content and corresponding to a direction of a gaze of the user may be activated. In this example, the audio object corresponding to the direction of the gaze of the user may be determined by measuring a direction of a head of the user wearing an HMD through head tracking and tracking the direction of the gaze of the user based on the direction of the head. In this example, whether an audio zooming effect is used or not may be set to be on, or set through a content producer flag.

A content to be reproduced in a VR may include one or more audio objects. An audio zooming effect not for all the included audio objects but for an audio object viewed by a user may be applied or activated, and the content may be reproduced accordingly.

For example, when a content to be reproduced in a VR includes a plurality of players, for example, player 1 corresponding to audio object 1 and player 2 corresponding to audio object 2, and a user views player 2, an audio zooming effect corresponding to player 2 may be applied and the content may then be reproduced accordingly. In this example, a direction of a gaze of the user may be tracked based on a direction of a head of the user, and player 2 which is audio object 2 corresponding to the tracked direction of the gaze of the user may be determined. The audio zooming effect corresponding to player 2 may be activated and reproduced. Thus, without an additional operation by the user, the user may selectively listen to a sound of an audio object of interest.

Figure 5:
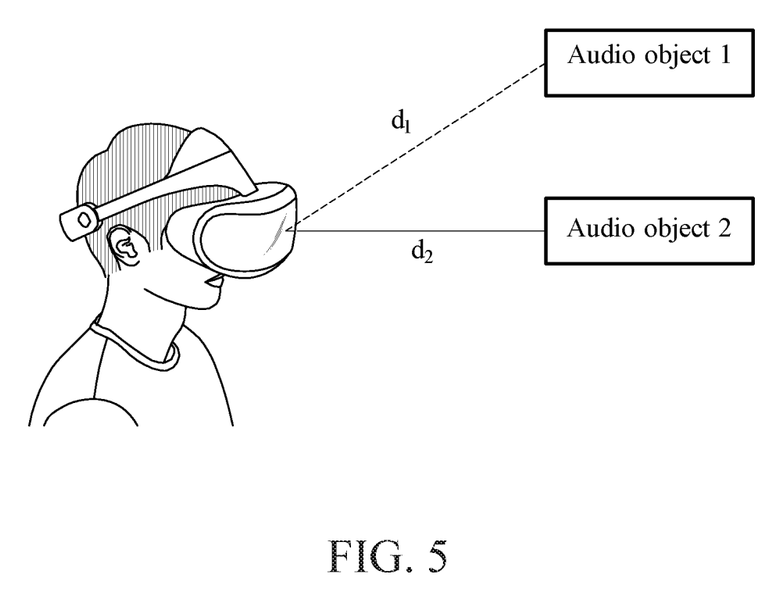
FIG. 5 is a diagram illustrating an example of determining whether to activate an audio zooming effect corresponding to an audio object based on a distance between a user and the audio object according to an example embodiment.

FIG. 5 is a diagram illustrating an example of determining whether to activate an audio zooming effect corresponding to an audio object based on a distance between a user and the audio object according to an example embodiment.

A user may wear an HMD or a similar apparatus, and a location of the user in a VR may be measured in real time using the HMD that measures a location and a direction of the user. Thus, a distance between an audio object included in a content to be reproduced in the VR and the user moving unrestrictedly in the VR may be measured in real time.

In an example, when an audio zooming effect corresponding to an audio object is set to be used, the audio zooming effect may be activated based on a distance between the audio object and a user.

For example, as illustrated, a distance d1 between a user wearing an HMD and audio object 1, and a distance d2 between the user and audio object 2 may be measured in real time. In this example, when d1>d2, an audio zooming effect corresponding to audio object 2 which is closer to the user in distance may be activated and reproduced. Alternatively, the audio zooming effect corresponding to both audio object 1 and audio object 2 may all be activated and reproduced. However, the user may more readily listen to the audio zooming effect corresponding to audio object 2 which is closer to the user.

Figure 6:
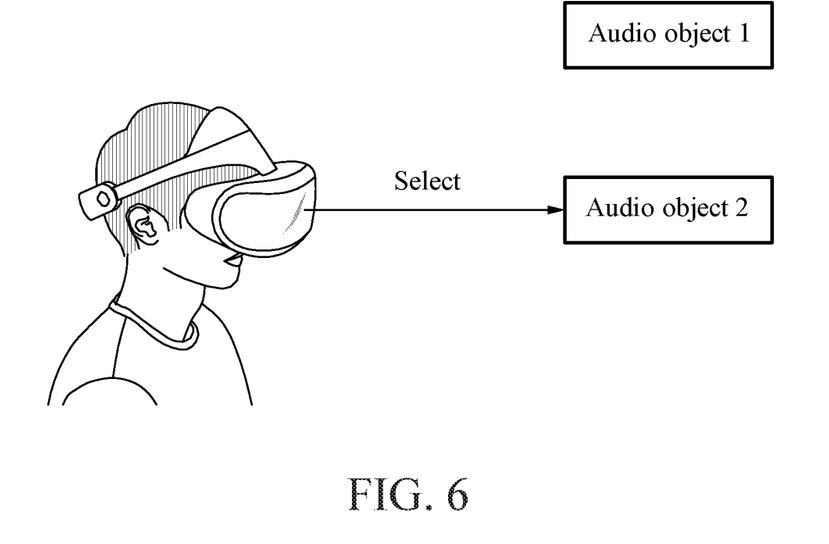
FIG. 6 a diagram illustrating an example of determining whether to activate an audio zooming effect corresponding to an audio object based on a random selection by a user according to an example embodiment.

FIG. 6 a diagram illustrating an example of whether to activate an audio zooming effect corresponding to an audio object based on a random selection by a user according to an example embodiment.

In an example, when an audio zooming effect corresponding to an audio object is set to be used, and a user selects the audio object, the audio zooming effect may be activated.

When a content including one or more audio objects is reproduced, an audio zooming effect corresponding to an audio object selected by a user may be activated. To the audio object selected by the user, the audio zooming effect corresponding to the selected audio object may be applied regardless of a direction or a distance between the user and the audio object.

For example, when a user selects audio object 2 from between audio object 1 and audio object 2, the user may listen to audio object 2 remotely regardless of a direction or a distance between the user and audio object 2.

Figure 7:
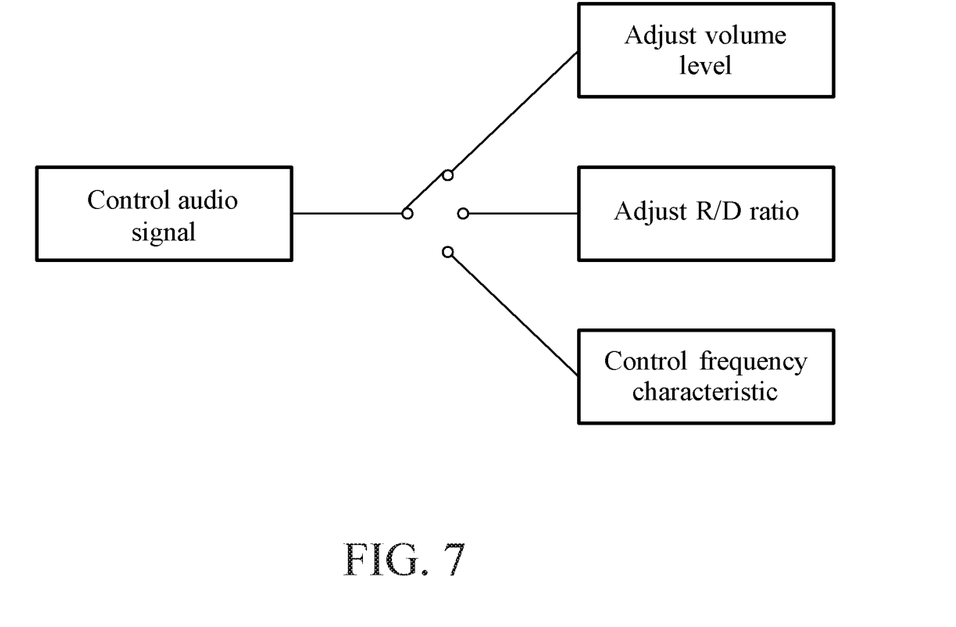
FIG. 7 is a diagram illustrating an example of a method of controlling an audio signal corresponding to an audio object according to an example embodiment.

FIG. 7 is a diagram illustrating an example of a method of controlling an audio signal corresponding to an audio object according to an example embodiment.

When an audio zooming effect corresponding to an audio object included in a content is activated, an audio signal corresponding to the audio object may be controlled based on a preset method and the activated audio zooming effect corresponding to the audio object may be modified, and the modified audio zooming effect may be reproduced.

For example, an audio zooming effect corresponding to an activated audio object may be controlled based on a volume level adjustment method, and applied to a corresponding content. In this example, a volume level of an audio signal corresponding to the activated audio object may be controlled to increase by a preset level compared to a volume level of an audio signal corresponding to an inactivated audio object.

For another example, an audio zooming effect corresponding to an activated audio object may be controlled based on a direct to reverberant (D/R) ratio, or a ratio of a direct sound to a reflected sound, and applied to a corresponding content. That is, the audio zooming effect may be controlled by controlling a D/R ratio of the activated audio object and a D/R ratio of an inactivated audio object.

In this example, by reducing a ratio of a direct sound to an indirect sound (e.g., reflected sound and reverberant sound) of an audio signal propagated directly from an activated audio object to be less than a ratio of a direct sound to an indirect sound of an audio signal corresponding to an inactivated audio object, it is possible to increase a rate of the direct sound from the activated audio object. That is, as a rate of a direct sound corresponding to an audio object increases, an audio zooming effect corresponding to the audio object may increase. In addition, as a rate of an indirect sound including a reflected sound and a reverberant sound corresponding to an audio object increases, an audio zooming effect corresponding to the audio object may decrease.

For still another example, an audio zooming effect corresponding to an activated audio object may be controlled by controlling a frequency characteristic of an activated audio object and a frequency characteristic of an inactivated audio object, by using a filter. In this example, using the filter, the frequency characteristic of the activated audio object may be enhanced or strengthened, and the frequency characteristic of the inactivated audio signal may be attenuated.

Figure 8:
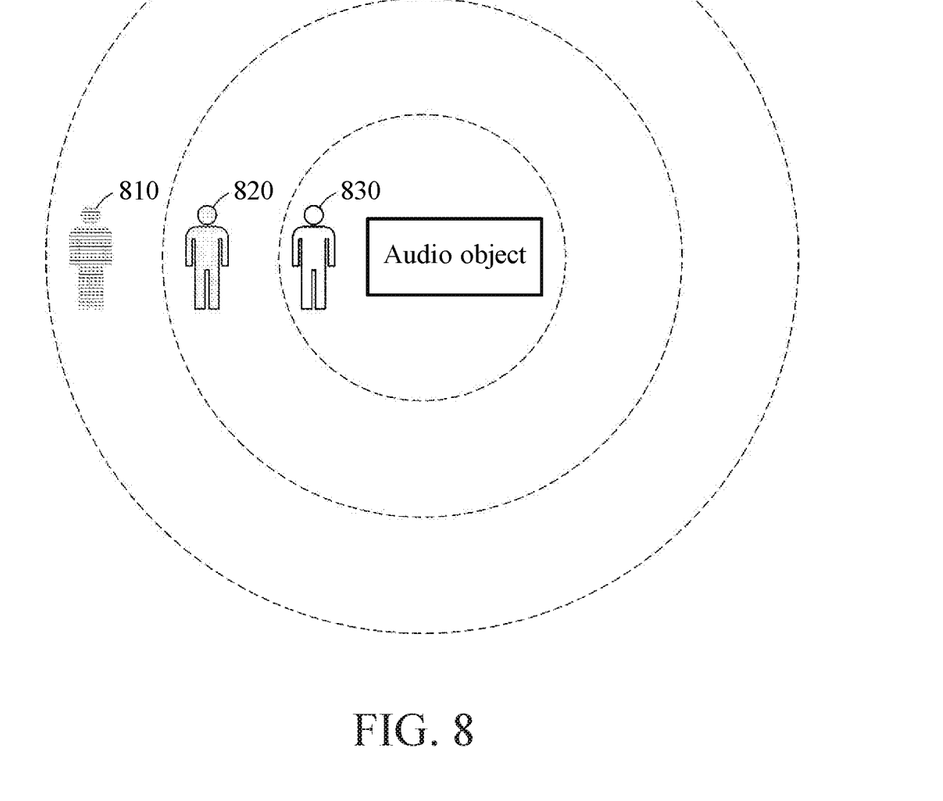
FIG. 8 is a diagram illustrating another example of a method of controlling an audio signal corresponding to an audio object according to an example embodiment.

FIG. 8 is a diagram illustrating another example of a method of controlling an audio signal corresponding to an audio object according to an example embodiment.

In an example, when an audio zooming effect is activated, an audio signal corresponding to an audio object may be controlled based on a distance from the audio object, and the audio zooming effect may be applied and reproduced accordingly.

When an audio zooming effect corresponding to an audio object is activated based on a gaze of a user, a distance between the user and the audio object, or a random selection by the user, the audio zooming effect may be applied differently based on a distance between the user and an audio object. In detail, the audio zooming effect may be enhanced or strengthened in inverse proportion to a distance between a user and an activated audio object.

For example, as illustrated, an audio zooming effect to be experienced by a user 820 from an activated audio object may be more enhanced or strengthened than an audio zooming effect to be experienced by a user 810 from the activated audio object. Similarly, an audio zooming effect to be experienced by a user 830 may be more enhanced or strengthened than the audio zooming effect to be experienced by the user 820. In this example, a degree or level by which the audio zooming effect is enhanced or strengthened based on a distance to a user may be processed by a preset value of a reproduction device or a playing device.

Figure 9:
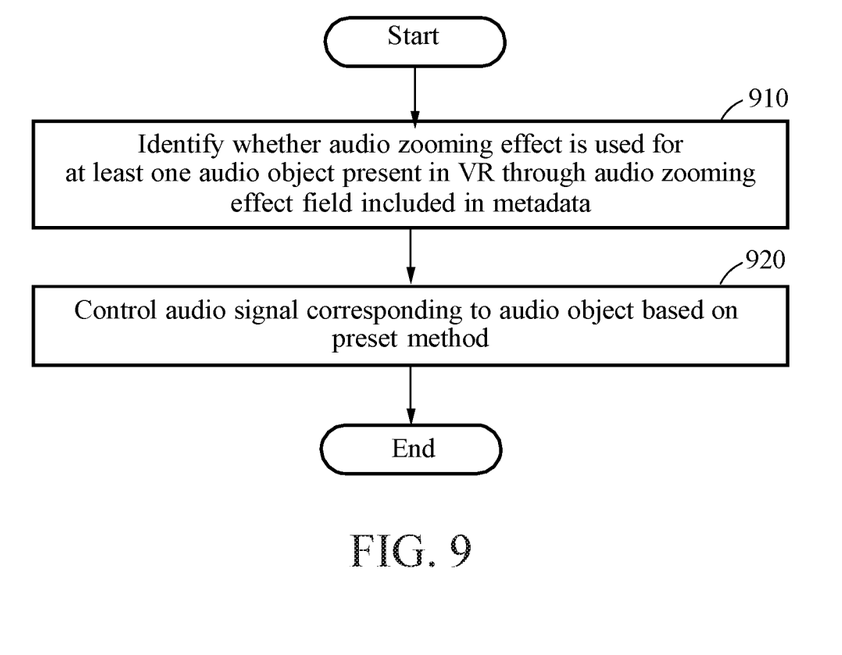
FIG. 9 is a flowchart illustrating an example of an audio signal controlling method to be performed by an audio signal controlling apparatus according to an example embodiment.

FIG. 9 is a flowchart illustrating an example of an audio signal controlling method to be performed by an audio signal controlling apparatus according to an example embodiment. The audio signal controlling method used herein may refer to a method of controlling an audio signal, and the audio signal controlling apparatus used herein may refer to an apparatus for controlling an audio signal.

In operation 910, an audio signal controlling apparatus may identify whether an audio zooming effect is used for at least one audio object present in a VR, through an audio zooming effect field included in metadata.

The audio signal controlling apparatus may identify whether the audio zooming effect is used or not for an audio object included in a content, using the metadata. For a more detailed description of the identifying of whether the audio zooming effect is used, reference may be made to what have been described above with reference to FIGS. 2 and 3.

For example, when the audio zooming effect is used for the audio object, the audio signal controlling apparatus may determine whether to activate the audio zooming effect. In this example, whether to activate the audio zooming effect may be determined based on a tracked direction of a gaze of the user, a distance between the user and the audio object, or a random selection by the user. For a more detailed description of the determining of whether to activate the audio zooming effect, reference may be made to what have been described above with reference to FIGS. 4 through 6.

In operation 920, the audio signal controlling apparatus controls an audio signal corresponding to the audio object based on a preset method. Thus, the audio zooming effect corresponding to the audio object may be adjusted and reproduced accordingly.

For example, the audio signal controlling apparatus may adjust and reproduce the audio zooming effect by controlling the audio signal based on a volume level adjustment method that adjusts a volume level of an audio object corresponding to an activated audio zooming effect to increase by a preset level compared to a volume level of an audio object corresponding to an inactivated audio zooming effect.

For another example, the audio signal controlling apparatus may adjust and reproduce the audio zooming effect by controlling the audio signal based on a D/R ratio adjustment method that adjusts a D/R ratio of an audio object corresponding to an activated audio zooming effect and a D/R ratio of an audio object corresponding to an inactivated audio zooming effect.

For still another example, the audio signal controlling apparatus may adjust and reproduce the audio zooming effect by controlling the audio signal based on a frequency characteristic control method that controls a frequency characteristic of an activated audio object and a frequency characteristic of an inactivated audio object using a filter. Herein, an activated audio object and an inactivated audio object may indicate an audio object corresponding to an activated audio zooming effect and an audio object corresponding to an inactivated audio zooming effect, respectively.

For yet another example, when a distance between a user and an audio object corresponding to an activated audio zooming effect is relatively short, compared to when a distance between the user and an audio object is relatively long, the audio signal controlling apparatus may adjust and reproduce the audio zooming effect such that the audio object located closer to the user may be more enhanced or strengthened.

Figure 10:
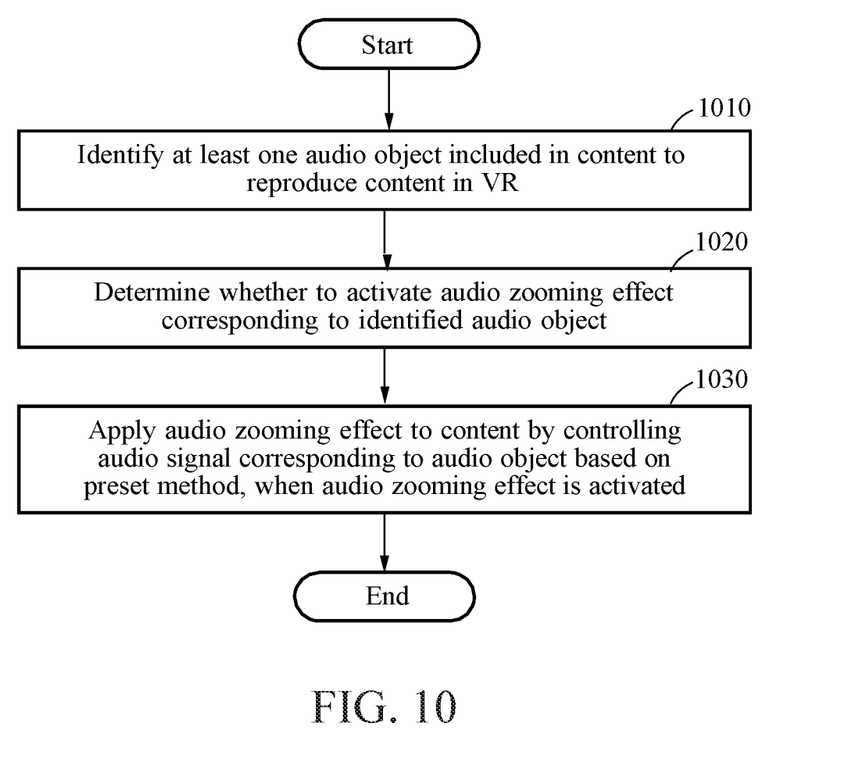
FIG. 10 is a flowchart illustrating another example of an audio signal controlling method to be performed by an audio signal controlling apparatus according to an example embodiment.

FIG. 10 is a flowchart illustrating another example of an audio signal controlling method to be performed by an audio signal controlling apparatus according to an example embodiment.

In operation 1010, an audio signal controlling apparatus identifies at least one audio object included in a content to reproduce the content in a VR. In operation 1020, the audio signal controlling apparatus determines whether to activate an audio zooming effect corresponding to the identified audio object. In operation 1030, when the audio zooming effect is activated, the audio signal controlling apparatus applies the audio zooming effect to the content by controlling an audio signal corresponding to the audio object based on a preset method. For a detailed description of each operation, reference may be made to what have been described above with reference to FIGS. 1 through 9.

The units described herein may be implemented using hardware components and software components. For example, the hardware components may include microphones, amplifiers, band-pass filters, audio to digital convertors, non-transitory computer memory and processing devices. A processing device may be implemented using one or more general-purpose or special purpose computers, such as, for example, a processor, a controller and an arithmetic logic unit (ALU), a digital signal processor, a microcomputer, a field programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums. The non-transitory computer readable recording medium may include any data storage device that can store data which can be thereafter read by a computer system or processing device.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

The invention claimed is:

1. An audio signal controlling method comprising:
   identifying whether an audio zooming effect is used for at least one audio object present in a virtual reality (VR) through an audio zooming effect field included in metadata; and
   when the audio zooming effect is identified as being used, controlling an audio signal corresponding to the audio object based on a preset method,
   wherein the controlling of the audio signal corresponding to the audio object based on the preset method comprises:
   controlling the audio signal based on a volume level adjustment method such that a volume level of an activated audio object increases by a preset level compared to a volume level of an inactivated audio object; and
   controlling the audio signal based on a direct to reverberant (D/R) ratio (a ratio of a direct sound to a reflected sound) adjustment method to control a D/R ratio of the activated audio object and a D/R ratio of the inactivated audio object.

2. The audio signal controlling method of claim 1, wherein the identifying of whether the audio zooming effect is used comprises:
   when the audio zooming effect corresponding to the audio object is used, determining whether to activate the audio zooming effect for the audio object.

3. The audio signal controlling method of claim 2, wherein the determining of whether to activate the audio zooming effect comprises:
   determining whether to activate the audio zooming effect based on a gaze of a user, a distance between the user and the audio object, or a random selection by the user.

4. The audio signal controlling method of claim 2, wherein the controlling of the audio signal corresponding to the audio object based on the preset method comprises:
   determining whether to increase a gain or a volume of the audio object in inverse proportion to a distance between a user and an activated audio object.

5. An audio signal controlling method comprising:
   identifying at least one audio object included in a content to reproduce the content in a virtual reality (VR);
   determining whether to activate an audio zooming effect corresponding to the identified audio object; and
   when the audio zooming effect is activated, applying the audio zooming effect to the content by controlling an audio signal corresponding to the audio object based on a preset method,
   wherein the applying of the audio zooming effect to the content by controlling the audio signal based on the preset method comprises:
   applying the audio zooming effect to the content based on a volume level adjustment method that controls a volume level of an activated audio object to increase by a preset level compared to a volume level of an inactivated audio object; and
   applying the audio zooming effect to the content based on a direct to reverberant (D/R) ratio (a ratio of a direct sound to a reflected sound) adjustment method that controls a D/R ratio of the activated audio object and a D/R ratio of the inactivated audio object.

6. The audio signal controlling method of claim 5, wherein the determining of whether to activate the audio zooming effect comprises:

determining whether to activate the audio zooming effect based on an audio object corresponding to a gaze of a user in the VR, a distance between the user and the audio object, or a random selection by the user.

7. The audio signal controlling method of claim 5, wherein the applying of the audio zooming effect to the content by controlling the audio signal based on the present method comprises:
when a distance between a user and an activated audio object is relatively short, compared to when a distance between the user and an activated audio object is relatively long, applying the audio zooming effect to increase a gain or a volume of the audio object present in the relatively short distance.

8. An audio signal controlling apparatus comprising:
a processor; and
a memory including a computer-readable instruction,
wherein, when the instruction is executed by the processor, the processor is configured to:
identify whether an audio zooming effect is used for at least one audio object present in a virtual reality (VR) through an audio zooming effect field included in metadata; and
when the audio zooming effect is identified as being used, control an audio signal corresponding to the audio object based on a preset method,
wherein, for the controlling of the audio signal corresponding to the audio object based on the preset method, the processor is configured to:
control the audio signal based on a volume level adjustment method such that a volume level of an activated audio object increases by a preset level compared to a volume level of an inactivated audio object; and
control the audio signal based on a direct to reverberant (D/R) ratio (a ratio of a direct sound to a reflected sound) adjustment method that controls a D/R ratio of the activated audio object and a D/R ratio of the inactivated audio object.

9. The audio signal controlling apparatus of claim 8, wherein, for the identifying of whether the audio zooming effect is used for the audio object, the processor is configured to:
when the audio zooming effect corresponding to the audio object is used, determine whether to activate the audio zooming effect for the audio object.

10. The audio signal controlling apparatus of claim 9, wherein the processor is configured to:
determine whether to activate the audio zooming effect based on a gaze of a user, a distance between the user and the audio object, or a random selection by the user.

11. The audio signal controlling apparatus of claim 9, wherein, for the controlling of the audio signal corresponding to the audio object based on the preset method, the processor is configured to:
determine whether to increase a gain or a volume of the audio object in inverse proportion to a distance between a user and an activated audio object.

* * * * *